(12) United States Patent
Hattori et al.

(10) Patent No.: US 9,263,289 B2
(45) Date of Patent: Feb. 16, 2016

(54) ADHESION-PROMOTING COMPOSITION USED BETWEEN CURABLE COMPOSITION FOR IMPRINTS AND SUBSTRATE, AND SEMICONDUCTOR DEVICE USING THE SAME

(71) Applicant: FUJIFILM CORPORATION, Minato-ku, Tokyo (JP)

(72) Inventors: Akiko Hattori, Haibara-gun (JP); Hirotaka Kitagawa, Haibara-gun (JP); Yuichiro Enomoto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/550,473

(22) Filed: Nov. 21, 2014

(65) Prior Publication Data

US 2015/0079793 A1    Mar. 19, 2015

Related U.S. Application Data

(63) Continuation of application No. PCT/JP2013/066547, filed on Jun. 17, 2013.

(30) Foreign Application Priority Data

Jun. 18, 2012    (JP) ................................. 2012-136895

(51) Int. Cl.
*C08G 59/00*    (2006.01)
*H01L 21/308*    (2006.01)
(Continued)

(52) U.S. Cl.
CPC .......... *H01L 21/3086* (2013.01); *C08F 299/02* (2013.01); *C09J 163/10* (2013.01); *G03F 7/0002* (2013.01); *G03F 7/0388* (2013.01); *H01L 21/3088* (2013.01); *H01L 2924/0002* (2013.01)

(58) Field of Classification Search
CPC .............. B05D 1/36; B05D 5/10; B44C 1/22; C09J 163/10; H01L 21/308
USPC .................... 428/207.1, 336, 195.1; 438/703; 528/87; 525/451; 427/264, 510; 216/49
See application file for complete search history.

(56) References Cited

U.S. PATENT DOCUMENTS 5,102,717 A * 4/1992 Butters .................... B41M 5/52
                                                    347/105
8,080,305 B2 * 12/2011 Biondi .................... B44C 1/165
                                                    428/195.1

(Continued)

FOREIGN PATENT DOCUMENTS

JP    2009-503139 A    1/2009
JP    2011-508680 A    3/2011

(Continued)

OTHER PUBLICATIONS

International Search Report of PCT/JP2013/066547, dated Jul. 30, 2013. [PCT/ISA/210].

(Continued)

*Primary Examiner* — Caleb Henry
(74) *Attorney, Agent, or Firm* — Sughrue Mion, PLLC

(57) ABSTRACT

Provided is an adhesion-promoting composition between a curable composition for imprints and a substrate, which excellent in adhesiveness and can control pattern failure. An adhesion-promoting composition used between a curable composition for imprints and a substrate, which comprises a compound having a molecular weight of 500 or larger and having a reactive group, and has a content of a compound, with a molecular weight of 200 or smaller, of more than 1% by mass and not more than 10% by mass of a total solid content.

17 Claims, 1 Drawing Sheet

(51) Int. Cl.
*C08F 299/02* (2006.01)
*G03F 7/00* (2006.01)
*C09J 163/10* (2006.01)
*G03F 7/038* (2006.01)

(56) References Cited

U.S. PATENT DOCUMENTS

| | | | | | |
|---|---|---|---|---|---|
| 8,778,458 | B2* | 7/2014 | Nagelsdiek | ............ | C09D 163/00 427/402 |
| 2002/0146568 | A1* | 10/2002 | Ho | ............ | B32B 27/40 428/423.3 |
| 2006/0131265 | A1* | 6/2006 | Samper | ............ | B81C 99/0095 216/41 |
| 2007/0051697 | A1* | 3/2007 | DiPietro | ............ | B82Y 10/00 216/52 |
| 2007/0059497 | A1* | 3/2007 | Huang | ............ | B82Y 10/00 428/195.1 |
| 2007/0139780 | A1* | 6/2007 | Suzuki | ............ | G02B 1/111 359/586 |
| 2009/0081430 | A1* | 3/2009 | Husemann | ............ | B32B 17/10009 428/212 |
| 2009/0081452 | A1* | 3/2009 | Husemann | ............ | B32B 7/12 428/346 |
| 2009/0117340 | A1* | 5/2009 | Halfyard | ............ | B42D 25/29 428/195.1 |
| 2009/0155583 | A1* | 6/2009 | Xu | ............ | B82Y 10/00 428/336 |
| 2009/0281250 | A1* | 11/2009 | DeSimone | ............ | C08G 59/30 525/418 |
| 2010/0003524 | A1* | 1/2010 | Luetzeler | ............ | B32B 7/12 428/412 |
| 2010/0003534 | A1* | 1/2010 | Luetzeler | ............ | B32B 7/12 428/480 |
| 2010/0038649 | A1* | 2/2010 | Lee | ............ | B29C 33/56 257/72 |
| 2010/0167081 | A1* | 7/2010 | Kim | ............ | C23C 18/206 428/600 |
| 2010/0289980 | A1* | 11/2010 | Husemann | ............ | C09J 7/0296 349/58 |
| 2010/0300533 | A1* | 12/2010 | Xia | ............ | B32B 17/10 136/259 |
| 2011/0151153 | A1* | 6/2011 | Felder | ............ | C08L 65/00 428/32.86 |
| 2011/0183127 | A1* | 7/2011 | Kodama | ............ | B82Y 10/00 428/195.1 |
| 2012/0034419 | A1* | 2/2012 | Washburn | ............ | H01L 21/0332 428/138 |
| 2012/0156448 | A1* | 6/2012 | Sunaga | ............ | C08F 283/14 428/195.1 |
| 2012/0183752 | A1* | 7/2012 | Kodama | ............ | B82Y 10/00 428/195.1 |
| 2012/0225263 | A1* | 9/2012 | Kodama | ............ | B82Y 10/00 428/195.1 |
| 2012/0231234 | A1* | 9/2012 | Kodama | ............ | B05D 3/06 428/195.1 |
| 2013/0011632 | A1* | 1/2013 | Ogino | ............ | C08F 283/02 428/195.1 |
| 2013/0045440 | A1* | 2/2013 | Tsuchihashi | ............ | C08F 12/24 430/5 |
| 2013/0052431 | A1* | 2/2013 | Enomoto | ............ | C09D 133/16 428/195.1 |
| 2013/0075361 | A1* | 3/2013 | Kawamonzen | ............ | B44C 1/227 216/41 |
| 2013/0101796 | A1* | 4/2013 | Arzt | ............ | B82Y 10/00 428/156 |
| 2013/0177746 | A1* | 7/2013 | Facke | ............ | B32B 27/40 428/195.1 |
| 2013/0288033 | A1* | 10/2013 | Costy | ............ | B41C 1/05 428/220 |
| 2014/0050900 | A1* | 2/2014 | Kodama | ............ | B82Y 10/00 428/195.1 |
| 2014/0220353 | A1* | 8/2014 | Kodama | ............ | G03F 7/094 428/411.1 |
| 2015/0011719 | A1* | 1/2015 | Mariott | ............ | C08F 210/16 526/123.1 |
| 2015/0104583 | A1* | 4/2015 | Garner | ............ | C04B 26/14 427/532 |

FOREIGN PATENT DOCUMENTS

| | | |
|---|---|---|
| WO | 2007/050133 A2 | 5/2007 |
| WO | 2009/085090 A1 | 7/2009 |
| WO | 2011/021573 A1 | 2/2011 |

OTHER PUBLICATIONS

Written Opinion of PCT/JP2013/066547, dated Jul. 30, 2013. [PCT/ISA/237].
International Preliminary Report on Patentability dated Dec. 31, 2014 from the International Searching Authority in counterpart Application No. PCT/JP2013/066547.
Office Action dated Jul. 14, 2015 from the Japanese Patent Office in counterpart Japanese Application No. 2012-136895.

* cited by examiner

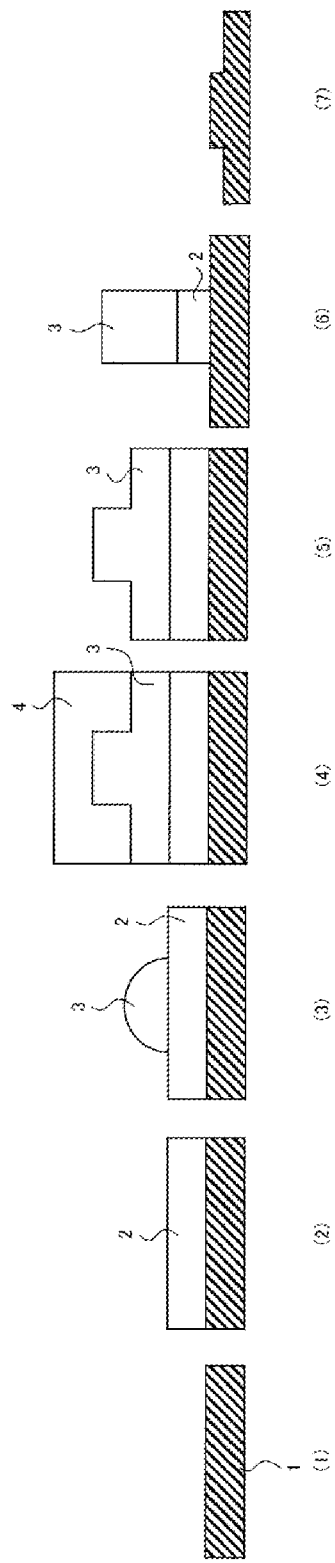

ADHESION-PROMOTING COMPOSITION USED BETWEEN CURABLE COMPOSITION FOR IMPRINTS AND SUBSTRATE, AND SEMICONDUCTOR DEVICE USING THE SAME

This application is a Continuation of PCT International Application No. PCT/JP2013/066547 filed on Jun. 17, 2013, which claims priority under 35 U.S.C §119(a) to Japanese Patent Application No. 2012-136895 filed on Jun. 18, 2012. Each of the above application(s) is hereby expressly incorporated by reference, in its entirety, into the present application.

TECHNICAL FIELD

The present invention relates to an adhesion-promoting composition which improves adhesiveness between a curable composition for imprints and a substrate. The present invention further relates to a cured film obtained by curing the adhesion-promoting composition, and a pattern forming method using the adhesion-promoting composition. The present invention further relates to a method of manufacturing a semiconductor device using the adhesion-promoting composition, and such semiconductor device.

In more details, the present invention relates to an adhesion-promoting composition which improves adhesiveness between a curable composition for imprints and a substrate, which are used for forming micropatterns by photoirradiation, and are used for manufacturing semiconductor integrated circuit; flat screen; microelectro-mechanical system (MEMS); sensor device; optical disk; magnetic recording media such as high density memory disk; optical components such as grating and relief hologram; nanodevice; optical device; optical film and polarizing device for manufacturing flat panel display; thin film transistor, organic transistor, color filter, overcoat layer, pillar component, rib component for aligning liquid crystal for liquid crystal display; microlens array; immunoassay chip; DNA chip; microreactor; nanobio device, optical waveguide; optical filter; photonic liquid crystal; and mold for imprints.

BACKGROUND ART

In recent years, pattern formation using resist has been employed in order to manufacture various devices. In particular, imprinting method takes advantages of easy repetitive molding of fine structures including nano-structure, and of less emission of hazardous waste or discharge, and is expected to be applied to various fields.

The imprinting method includes two technologies, which are thermal imprinting using thermoplastic resin as a workpiece, and photo-imprinting using curable composition for imprints. In the thermal imprinting, a mold is pressed against a polymer resin heated at or above the glass transition temperature, and is then released after cooled, to thereby transfer a fine structure onto the resin on a substrate. The method is applicable to a variety of resin materials and also to glass materials, and is expected to be applied to various fields.

On the other hand, in the photo-imprint method where a photo-curable composition is cured by photo irradiation through a transparent mold or a transparent substrate, the transferring material does not require heating in pressing it against the mold, and therefore the method enables room-temperature imprinting. Recently, new developments having the advantages of the above two as combined, have been reported, including a nanocasting method and a reversal imprint method for forming three-dimensional structures.

For the nanoimprint methods as above, proposed are applied technologies mentioned below.

In the first technology, the molded pattern itself has a function, and is applied to various elements in nanotechnology and to structural members. Its examples include various micro/nano. optical elements and high-density recording media, as well as structural members in optical films, flat panel displays, etc.

The second technology is for hybrid-molding of microstructures and nanostructures, or for construction of laminate structures through simple interlayer positioning, and this is applied to production of .mu.-TAS (micro-total analysis system) and biochips.

In the third technology, the formed pattern is used as a mask and is applied to a method of processing a substrate through etching or the like.

In these technologies, high-precision positioning is combined with high-density integration; and in place of conventional lithography technology, these technologies are being applied to production of high-density semiconductor integrated circuits and transistors in liquid-crystal displays, and also to magnetic processing for next-generation hard discs referred to as patterned media. Recently, the action on industrialization of the above-mentioned nanoimprint technologies and their applied technologies has become active for practical use thereof.

As activities regarding the photonanoimprint method have increased, an issue of adhesiveness between a substrate and a curable composition for imprints has been gaining more attention. In more details, the curable composition for imprints is generally applied to the surface of the substrate to form a layer, and is cured by photoirradiation while being kept under a mold, but the curable composition for imprints may adhere onto the mold when the mold is separated thereafter. Poor separability of the mold may degrade formability of the resultant patterns. This is ascribable to apart of the curable composition for imprints remaining on the mold.

There has therefore been a need to enhance adhesiveness between the substrate and the curable composition for imprints. Known methods of enhancing the adhesiveness between the substrate and the curable composition for imprints are described in Patent Literature 1 and Patent Literature 2. More specifically, according to Patent Literature 1, a polymerizable monomer having a group capable of interacting with the substrate is used to enhance the adhesiveness between the substrate and the curable composition for imprints. According to Patent Literature 2, an aromatic polymer is used to enhance the adhesiveness between the substrate and the curable composition for imprints.

CITATION LIST

Patent Literature

[Patent Literature 1] JP-T-2009-503139
[Patent Literature 2] JP-T-2011-508680

SUMMARY OF THE INVENTION

Technical Problem

The present inventors, however, found from examination on Patent Literature 1 and Patent Literature 2 that these technologies can result in failures in the pattern formed using the curable composition for imprints. It is therefore an object of the present invention to solve the above-described problem, and is to provide an adhesion-promoting composition used between substrate and curable composition for imprints, less causative of failures in the resultant pattern.

Solution to Problem

From investigations considering the above, the present inventors found that the adhesion-promoting compositions used between a curable composition for imprints and a substrate, described in Patent Literature 1 and Patent Literature 2, contain cross-linking agent, catalyst and so forth, which became clear to induce the pattern failures. In more detail, a layer (underlying layer) for improving adhesiveness between a curable composition for imprints and a substrate will have applied over the surface thereof with the curable composition for imprints, so that in order to avoid mixing of the two, the adhesion-promoting composition used between a composition for imprints and a substrate is formed into a layer, and then pre-cured prior to application of the curable composition for imprints. It was, however, found that in the process of pre-curing, compounds with molecular weights of 200 or smaller, such as cross-linking agent, catalyst and so forth, contained in the adhesion-promoting composition would partially or totally sublime, if the contents are large. The thus-sublimed substances would fill up inside a pattern forming apparatus, reside as foreign matters on the surface of the curable composition for imprints, and cause pattern failures. The present inventors then discussed to reduce the amount of mixing of the low-molecular-weight compounds such as cross-linking agent and catalyst. On the other hand, it was also found that the coatability would degrade without being mixed with the compounds having a molecular weight of 200 or smaller. The present invention was accomplished based on such findings. More specifically, the above-described problems were solved by the means below.

Specifically, the problems were solved by the configuration <1>, preferably by configurations <2> to <11> below.
<1> An adhesion-promoting composition used between a curable composition for imprints and a substrate, which comprises a compound having a molecular weight of 500 or larger and having a reactive group, and has a content of a compound, with a molecular weight of 200 or smaller, of more than 1% by mass and not more than 10% by mass of a total solid content.
<2> The adhesion-promoting composition used between a curable composition for imprints and a substrate of <1>, wherein at least one kind of the compounds having a molecular weight of 500 or larger and having a reactive group is a novolac-type epoxy (meth)acrylate polymer.
<3> The adhesion-promoting composition used between a curable composition for imprints and a substrate of <1>, wherein the compound having a molecular weight of 500 or larger and having a reactive group is a polymer being free from a cyclic structure in a side chain of the polymer.
<4> The adhesion-promoting composition used between a curable composition for imprints and a substrate of <1>, wherein the compound having a molecular weight of 500 or larger and having a reactive group is a novolac-type epoxy (meth)acrylate polymer, and is a polymer being free from a cyclic structure in a side chain of the polymer.
<5> The adhesion-promoting composition used between a curable composition for imprints and a substrate of any one of <1> to <4>, wherein the compound having a molecular weight of 500 or larger and having a reactive group is a polymer, and; the compound having a molecular weight of 200 or smaller is a monomer which composes the polymer, or a compound obtained by polymerizing two or more of the monomers.
<6> A cured article obtained by curing an adhesion-promoting composition used between a curable composition for imprints and a substrate of any one of <1> to <5>.
<7> A pattern forming method comprising: applying the adhesion-promoting composition used between a curable composition for imprints and a substrate of any one of <1> to <5>, in the substrate to form an underlying layer; and, applying the curable composition for imprints on a surface of the underlying layer.
<8> The pattern forming method of <7>, further comprising: subsequently to applying the adhesion-promoting composition used between a curable composition for imprints and a substrate in the substrate, curing by heating or photo-irradiation a part of the adhesion-promoting composition used between a curable composition for imprints and a substrate; and applying the curable composition for imprints on a surface thereof.
<9> The pattern forming method of <8>, further comprising: subjecting the curable composition for imprints and the underlying layer, being held between the substrate and a finely-patterned mold, to photo-irradiation to thereby cure the curable composition for imprints; and removing the mold.
<10> A method of manufacturing a semiconductor device comprising the pattern forming method of any one of <7> to <9>.
<11> A semiconductor device manufactured by the method of manufacturing a semiconductor device of <10>.

Advantageous Effects of Invention

The present invention makes it possible to provide adhesion-promoting composition between a curable composition for imprints and a substrate, which excellent in adhesiveness and can control pattern failure.

BRIEF DESCRIPTION OF DRAWINGS

FIG. 1 is a drawing illustrating an exemplary process of manufacturing in which the curable composition for imprints is used for etching of a substrate.

DESCRIPTION OF EMBODIMENTS

The present invention will be explained in detail below. As used herein, the numerical ranges expressed with "to" are used to mean the ranges including the values indicated before and after "to" as lower and upper limits.

In this specification, "(meth)acrylate" means acrylate and methacrylate, "(meth)acryl" means acryl and methacryl, and "(meth)acryloyl" means acryloyl and methacryloyl. Also in this specification, "monomer" is synonymous to "monomer". The monomer in the context of the present invention is discriminated from oligomer and polymer, and means a sort of compound having a weight-average molecular weight of 1,000 or smaller. In this specification, "functional group" means a sort of group which takes part in polymerization reaction.

"Imprint" in the context of the present invention means pattern transfer in a size of 1 nm to 10 mm, and more preferably means pattern transfer in a size of approximately 10 nm to 100 μm (nano-imprinting).

In this specification, notation of group (atomic group) without being preceded by "substituted" or "unsubstituted", is used to encompass not only group having no substituent, but also group having substituent. For example, "alkyl group"

encompass not only alkyl group having no substituent (unsubstituted alkyl group), but also alkyl group having substituent (substituted alkyl group).

The adhesion-promoting composition used between a curable composition for imprints and a substrate (may be simply referred to as "adhesion-promoting composition", hereinafter) of the present invention characteristically contains a compound having a molecular weight of 500 or larger and having a reactive group, where the content of a compound, with a molecular weight of 200 or smaller, is more than 1% by mass and not more than 10% by mass of the total solid content. As described above, it has been general to add cross-linking agent and catalyst to the adhesion-promoting composition. The cross-linking agent and the catalyst have, however, vaporized in the process of heat curing (pre-curing), and the volatiles cooled in the apparatus have remained therein as sublimates, and this has caused failures after coating of the curable composition for imprints. On the other hand, complete elimination of the low-molecular-weight components would degrade the adhesiveness between the substrate and the curable composition for imprints. The present invention succeeded in solving such problem, by controlling the content of the compound with a molecular weight of 200 or smaller to more than 1% by mass and not more than 10% by mass of the total solid content.

<Compound Having Molecular Weight of 500 or Larger, and Having Reactive Group>

The adhesion-promoting composition of the present invention contains a compound having a molecular weight of 500 or larger, and a reactive group (also may be referred to as "compound A", hereinafter). By admixing such compound, the adhesiveness between the curable composition for imprints and the substrate may be improved. Now the reactive group is preferably a group capable of binding with the curable composition for imprints, and more preferably a group polymerizable with a polymerizable functional group contained in the curable composition for imprints. The reactive group is furthermore preferably a (meth)acryloyl group, epoxy group, oxetanyl group, or maleimide group. (Meth)acryloyl group is particularly preferable.

The molecular weight of compound A used in the present invention is preferably 1000 or larger, and more preferably 3000 or larger. The upper limit of the molecular weight is preferably 200000 or smaller, more preferably 100000 or smaller, furthermore preferably 50000 or smaller, and particularly 10000 or smaller. By limiting the molecular weight as described above, vaporization of the compounds may be suppressed, and the surface quality when coated over the substrate may be made good.

Compound A used in the present invention is preferably a polymer. When the polymer is used, the molecular weight is given by weight-average molecular weight. Compound A used in the present invention is preferably a polymer being free from a cyclic structure in the side chain thereof. Use of this sort of polymer gives advantages over a polymer having a cyclic structure in the side chain thereof, in that interaction between the adjacent molecules may be suppressed, thereby the aggregation may be suppressed, a better surface quality after coated over the substrate is obtainable, and the pattern failure may be suppressed in a more efficient manner. The cyclic structure is exemplified by five-membered ring and six-membered ring, wherein the six-membered ring is preferable. The cyclic structure is preferably represented by hydrocarbon group, and more preferably by unsaturated hydrocarbon group.

Compound A used in the present invention preferably contains an aromatic ring in the principal chain thereof, wherein the principal chain is preferably composed of an aromatic ring and an alkylene group, and is more preferably configured by alternately-binding benzene rings and methylene groups.

Compound A used in the present invention preferably has a reactive group in the side chain thereof, more preferably has a (meth)acryloyl group in the side chain, and furthermore preferably has an acryloyl group in the side chain.

Compound A used in the present invention is preferably a polymer mainly composed of a structural unit represented by the formula (A) below, and more preferably a polymer in which the structural unit represented by the formula (A) below accounts for 90 mol % or more.

[Chemical Formula 1]

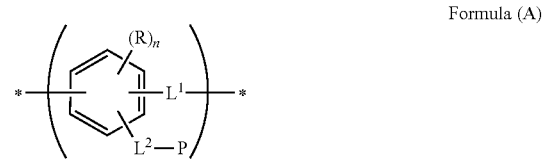

Formula (A)

(In the formula (A), R represents an alkyl group, each of $L^1$ and $L^2$ independently represents a divalent linking group, and P represents a polymerizable group. N represents an integer of 0 to 3.)

R is preferably a $C_{1-5}$ alkyl group, and more preferably a methyl group.

$L^1$ preferably represents an alkylene group, more preferably a $C_{1-3}$ alkylene group, and more preferably —$CH_2$—.

$L^2$ preferably represents —$CH_2$—, —O—, —CHR (R represents a substituent)-, or a divalent linking group composed of two or more of them. R preferably represent an OH group.

P preferably represents a (meth)acryloyl group, and more preferably represents an acryloyl group.

N preferably represents an integer of 0 to 2, and more preferably 0 or 1.

Compound A used in the present invention is specifically exemplified by epoxy (meth)acrylate polymer, and preferably by a novolac-type epoxy (meth)acrylate polymer. The novolac-type epoxy (meth)acrylate is exemplified by cresol novolac and phenol novolac, both of which are preferable.

The content of Compound (A) in the adhesion-promoting composition of the present invention is preferably 30% by mass or more of the total ingredients excluding solvent, more preferably 50% by mass or more, furthermore preferably 70% by mass or more, and particularly 90% by mass or more.

In the adhesion-promoting composition of the present invention, the content of the compound with a molecular weight of 200 or smaller (may occasionally be referred to as "low-molecular-weight compound", hereinafter) is more than 1% by mass and not more than 10% by mass of the total solid content. It is preferable that the content of the compound with a molecular weight of 300 or smaller is more than 1% by mass and not more than 10% by mass of the total solid content, and it is more preferable that the compound with a molecular weight of 400 or smaller is more than 1% by mass and not more than 10% by mass of the total solid content. The content of such low-molecular-weight compound is more preferably more than 1% by mass and not more than 5% by mass of the total solid content. With the content of the low-molecular-weight compound controlled to more than 1% by mass of the total solid content, the low-molecular weight compound is now arranged to form a matrix around the high-molecular-weight component, and thereby the coatability may be improved.

The low-molecular-weight compound preferably has a structure closely resemble to that of Compound A. When Compound A is a polymer, it is exemplified by a monomer composing such polymer, and a compound composed of two or more monomers composing the polymer.

The adhesion-promoting composition preferably contains substantially no cross-linking agent and no polymerization initiator as the low-molecular weight compound, and more preferably contains substantially no cross-linking agent, no polymerization initiator, no silane coupling agent and no surfactant. The phrase "contains substantially no something" means that the content of something does not affect the effects of the present invention, wherein the content may be limited to 0.1% by mass or less, for example.

<Solvent>

The adhesion-promoting composition of the present invention preferably contains a solvent. Preferably, the solvent has a boiling point at normal pressure of from 80 to 200° C. Regarding the type of the solvent, any solvent capable of dissolving the underlying film composition may be used. Preferred are solvents having at least any one of an ester structure, a ketone structure, a hydroxyl group and an ether structure. Concretely, the solvent is preferably one or more selected from propylene glycol monomethyl ether acetate, cyclohexanone, 2-heptanone, gamma-butyrolactone, propylene glycol monomethyl ether, ethyl lactate. Most preferred is a solvent containing propylene glycol monomethyl ether acetate as securing coating uniformity.

The content of the solvent in the adhesion-promoting composition of the present invention is optimally adjusted depending on the viscosity of the components excluding the solvent, coatability, and target thickness of the film. From the viewpoint of improving the coat ability, the amount of addition may be 70% by mass or more of the total components, preferably 90% by mass or more.

The adhesion-promoting composition of the present invention preferably contains 10% by mass or less, relative to the total ingredients, of ingredient other than compound A, the low-molecular weight compound and the solvent, and more preferably contains substantially no such ingredient.

The adhesion-promoting composition of the present invention may be prepared by mixing the individual ingredients described above. After mixing the individual ingredients, the mixture is preferably filtered through a filter with a pore size of 0.003 µm to 5.0 µm. The filtration may be conducted in a multi-stage manner or may be repeated multiple times. The filtrate may be re-filtered. Materials for composing the filter is selectable from polyethylene resin, polypropylene resin, fluorine-containing resin, nylon resin and so forth, without special limitation.

<Curable Composition for Imprints>

The curable composition for imprints, used in combination with the adhesion-promoting composition of the present invention, generally contains a polymerizable compound and a polymerization initiator.

Polymerizable Compound

While species of the polymerizable compound used for the curable composition for imprints in the present invention is not specifically limited so long as it does not departs from the spirit of the present invention, preferable examples include polymerizable unsaturated monomer having 1 to 6 ethylenic unsaturated bond-containing group; epoxy compound and oxetane compound; vinyl ether compound; styrene derivative; and propenylether or butenyl ether. The curable composition for imprints preferably has a polymerizable group capable of polymerizing with a polymerizable group on the adhesion-promoting composition. Among them, (meth)acrylate is preferable. Specific examples of these compounds are exemplified by those described in paragraphs [0020] to [0098] of JP-A-2011-231308, the contents of which are incorporated by reference into this specification.

As the polymerizable compound, preferably contained is a polymerizable compound having an alicyclic hydrocarbon group and/or aromatic group, and, more preferably contained are both of the polymerizable compound having an alicyclic hydrocarbon group and/or aromatic group, and a polymerizable compound having containing silicon atom and/or fluorine atom. It is further preferable that the total mass of the polymerizable compounds having an alicyclic hydrocarbon group and/or aromatic group, out of all polymerizable components contained in the curable composition for imprints of the present invention, is 30 to 100% by mass relative to the total polymerizable compounds, more preferably 50 to 100% by mass, and still more preferably 70 to 100% by mass.

In a more preferable embodiment, as the polymerizable compound, the (meth)acrylate polymerizable compound containing aromatic group preferably accounts for 50 to 100% by mass of the total polymerizable components, more preferably 70 to 100% by mass, and particularly 90 to 100% by mass. In a particularly preferable embodiment, a polymerizable compound (1) described below accounts for 0 to 80% by mass of the total polymerizable components (more preferably 20 to 70% by mass) a polymerizable compound (2) described below accounts for 20 to 100% by mass of the total polymerizable components (more preferably 50 to 100% by mass), and a polymerizable compound (3) described below accounts for 0 to 10% by mass of the total polymerizable components (more preferably 0.1 to 6% by mass).

(1) Polymerizable compound having an aromatic group (preferably phenyl group or naphthyl group, and more preferably naphthyl group) and a (meth)acrylate group;

(2) polymerizable compound having an aromatic group (preferably phenyl group or naphthyl group, and more preferably phenyl group) and two (meth)acrylate groups; and (3) polymerizable compound having at least either one of fluorine atom and silicon atom, and a (meth)acrylate group.

In the curable composition for imprints, content of the polymerizable compound having a viscosity at 25° C. of smaller than 5 mP·s is 50% by mass or less, relative to the total polymerizable compound, more preferably 30% by mass or less, and still more preferably 10% by mass or less. By adjusting the content to the above-described ranges, stability of discharge of ink in the ink jet process may be improved, and transfer failure in imprinting may be reduced.

Polymerization Initiator

In the curable composition for imprints used in the present invention, a photo-polymerization initiator is contained. The photo-polymerization initiator used in the present invention may be any compound which generates an active species capable of polymerizing the above-described polymerizable compound under photoirradiation. The photo-polymerization initiator is preferably a radical polymerization initiator or cationic polymerization, and the radical polymerization initiator is more preferable. In the present invention, a plurality of species of photo-polymerization initiator may be used.

The radical photo-polymerization initiator usable in the present invention is exemplified by those described for example in paragraph [0091] of JP-A-2008-105414 may preferably be used. Among them, acetophenone-based compound, acylphosphine oxide-based compound, and oxim ester-based compound are preferable from the viewpoints of curing sensitivity and absorption characteristics.

The acetophenone-base compound may preferably be exemplified by hydroxyacetophenone-base compound, dialkoxyacetophenone-base compound, and aminoacetophenone-base compound. The hydroxyacetophenone-base compound may preferably be exemplified by Irgacure (registered trademark) 2959 (1-[4-(2-hydroxyethoxy) phenyl]-2-hydroxy-2-methyl-1-propane-1-one, Irgacure (registered trademark) 184 (1-hydroxycyclohexylphenylketone), Irgacure (registered trademark) 500 (1-hydroxycyclohexylphenylketone, benzophenone), Darocur (registered trademark) 1173 (2-hydroxy-2-methyl-1-phenyl-1-propane-1-one), all of which are available from.

The dialkoxyacetophenone-base compound may preferably be exemplified by Irgacure (registered trademark) 651 (2,2-dimethoxy-1,2-diphenylethane-1-one) available from BASF GmbH.

The aminoacetophenone-base compound may preferably be exemplified by Irgacure (registered trademark) 369 (2-benzyl-2-dimethylamino-1-(4-morpholinophenyl) butanone-1), Irgacure (registered trademark) 379 (EG) (2-dimethylamino-2-(4-methylbenzyl)-1-(4-morpholine-4-yl-phenyl) butane-1-one), and Irgacure (registered trademark) 907 (2-methyl-1-[4-methylthiophenyl]-2-morpholinopropane-1-one), all of which are available from BASF GmbH.

The acylphosphine oxide-base compound may preferably be exemplified by Irgacure (registered trademark) 819 (bis(2,4,6-trimethylbenzoyl)-phenylphosphine oxide), Irgacure (registered trademark) 1800 (bis(2,6-dimethoxybenzoyl)-2,4,4-trimethyl-pentylphosphine oxide), Lucirin TPO (2,4,6-trimethylbenzoyldiphenylphosphine oxide), and Lucirin TPO-L (2,4,-trimethylbenzoylphenylethoxyphosphine oxide), all of which are available from BASF GmbH.

The oxime ester-base compound may preferably be exemplified by Irgacure (registered trademark) OXE01 (1,2-octanedione, 1-[4-(phenylthio) phenyl]-2-O-benzoyloxime)), and Irgacure (registered trademark) OXE02 (ethanone, 1-[9-ethyl-6-(2-methylbenzoyl)-9H-carbazole-3-yl]-1-(O-acetyloxime)), all of which are available from BASF GmbH.

Preferable examples of the cationic photo-polymerization initiator suitably used for the present invention include sulfonium salt compound, iodonium salt compound and oxime sulfonate compound, which are exemplified by 4-methylphenyl[4-(1-methylethyl)phenyliodonium tetrakis(pentafluorophenyl) borate (PI2074, from Rhodia Inc.), 4-methylphenyl [4-(2-methylpropyl)phenyliodonium hexafluorophosphate (Irgacure 250, from BASF), and Irgacure PAG103, 108, 121, 203 (from BASF).

In the present invention, "light" includes not only those in the wavelength regions of UV, near-UV, deep-UV, visible light and infrared, and other electromagnetic waves, but also radiation ray. The radiation ray includes microwave, electron beam, EUV and X-ray. Also laser light such as 248 nm excimer laser, 193 nm excimer laser, and 172 nm excimer laser are usable. These sorts of light may be monochromatic light obtained after being passed through an optical filter, or may be composite light composed of a plurality of light components with different wavelengths.

The content of the polymerization inhibitor is from 0.01 to 15% by mass, more preferably from 0.1 to 12% by mass, and even more preferably from 0.2 to 7% by mass, relative to the composition excluding the solvent. When two or more species of surfactants are used, the total content of them falls in any of these ranges.

When the content of the polymerization initiator is 0.01% by mass or more, which content is preferable, the photo-sensitivity (rapid-curability), the resolving property, the line-edge roughness, and the strength of the coating film tend to be improved. On the other hand, when the content of the polymerization initiator is 15% by mass or less, which content is preferable, the photo-transparency, the colorability, and the handling property tend to be enhanced.

Surfactant

The curable composition for imprints used in the present invention preferably contains a surfactant. The surfactant used in the present invention is exemplified by those similar to the surfactants described in reference to the aforementioned adhesion-promoting composition. The content of the surfactant used in the present invention, relative to the total ingredients, is typically 0.001 to 5% by mass, preferably 0.002 to 4% by mass, and more preferably 0.005 to 3% by mass. When two or more species of surfactants are used, the total content of them falls in any of these ranges. With the surfactant fallen in the range from 0.001 to 5% by mass of the composition, the composition will be highly effective in terms of uniformity of coating, and will be less likely to degrade the mold transfer characteristic due to excess of surfactant.

Preferably, the composition comprises at least one of a fluorine-containing surfactant, a silicone-type surfactant and a fluorine-containing silicone-type surfactant. More preferably, the composition comprises both a fluorine-containing surfactant and a silicone-type surfactant, or a fluorine-containing silicone-type surfactant. The most preferably, the composition comprises a fluorine-containing silicone-type surfactant. As the fluorine-containing surfactant and the silicone-type surfactant, preferred are nonionic surfactants.

"Fluorine-containing silicone-type surfactant" as referred to herein means a surfactant satisfying both the requirement of a fluorine-containing surfactant and that of a silicone-type surfactant.

Using the surfactant of the type may solve the problem of coating failures such as striation and flaky pattern formation (drying unevenness of resist film) that may occur when the composition for imprints of the invention is applied onto substrates on which various films are formed, for example, onto silicon wafers in semiconductor production, or onto glass square substrates, chromium films, molybdenum films, molybdenum alloy films, tantalum films, tantalum alloy films, silicon nitride films, amorphous silicon films, tin oxide-doped indium oxide (ITO) films or tin oxide films in production of liquid-crystal devices. In particular, when the above-mentioned surfactant is added to the underlying film composition for imprints of the invention, the coating uniformity of the composition can be greatly improved; and in coating with it using a spin coater or a slit scan coater, the composition ensures good coating aptitude irrespective of the size of the substrate to which it is applied.

Examples of the nonionic fluorine-containing surfactant usable in the invention include Fluorad FC-430, FC-431 (Sumitomo 3M's trade names); Surflon S-382 (Asahi Glass's trade name); Eftop EF-122A, 122B, 122C EF-121, 'EF-126, EF-127, MF-100 (Tochem Products' trade names); PF-636, PF-6320, PF-656, PF-6520 (Omnova Solution's trade names); Futagent FT250, FT251, DFX18 (Neos' trade names); Unidyne DS-401, DS-403, DS-451 (Daikin's trade names); Megafac 171, 172, 173, 178K, 178A, F780F (DIC's trade names).

Further, examples of the silicone-based nonionic surfactant (manufactured by Dainippon Ink and Chemicals Co., Ltd.), trade name SI-10 series (manufactured by Takemoto Oil & Fat Co., Ltd.), Megaface pane Todd 31 KP (Shin-Etsu Chemical Co., Ltd.), and the like -341.

Examples of the fluorine-containing silicone-type surfactant include X-70-090, X-70-091, X-70-092, X-70-093 (Shin-Etsu Chemical's trade names); Megafac R-08, XRB-4 (DIC's trade names).

Non-Polymerizable Compound

The composition of the present invention preferably contains a non-polymerizable compound which has a polyalkylene glycol structure having, at the terminal thereof, at least one hydroxy group or has a polyalkylene glycol structure having, at the terminal thereof, at least one etherified hydroxy group. The non-polymerizable compound contains substantially no fluorine atom and silicon atom.

The non-polymerizable compound herein means a compound having no polymerizable group.

The polyalkylene structure owned by the non-polymerizable compound used in the present invention is preferably a polyalkylene glycol structure having a $C_{1-6}$ alkylene group, polyethylene glycol structure, polypropylene glycol structure, polybutylene glycol structure, or mixed structure of them, wherein polyethylene glycol structure, polypropylene glycol structure, or mixed structure of them is more preferable, and polypropylene glycol structure is particularly preferable.

The non-polymerizable compound is preferably configured substantially by the polyalkylene glycol structure only, except for the terminal substituent. Note that "substantially" herein means that contents of the constituents other than polyalkylene glycol structure is 5% by mass or less, and preferably 1% by mass or less, of the total. In the present invention, it is particularly preferable that a compound substantially composed of polypropylene glycol structure only is contained as the non-polymerizable compound.

The polyalkylene glycol structure preferably has 3 to 1000 units of alkylene glycol constitutive unit, and more preferably 4 to 500 units, still more preferably 5 to 100 units, and most preferably 5 to 50 units.

Weight average molecular weight (Mw) of the component is preferably 150 to 10,000, more preferably 200 to 5,000, still more preferably 500 to 4,000, and furthermore preferably 600 to 3,000.

Note that "containing substantially no fluorine atom and silicon atom" typically means that the total content of the fluorine atom and silicon atom is 1% or less. It is preferable that neither fluorine atom nor silicon atom is contained. By virtue of absence of fluorine atom and silicon atom, the component is improved in compatibility with the polymerizable compound, and thereby the curable composition, in particular the one containing no solvent, may be improved in uniformity of coating, patternability in imprints, and line edge roughness after dry etching.

The non-polymerizable compound has, at the terminal thereof, at least one hydroxy group or etherified hydroxy group. Provided that at least one hydroxy group or etherified hydroxy group resides at the terminal, the other terminal may have a hydroxy group, or may have a hydroxy group having the hydrogen atom thereof substituted. Preferable examples of the group possibly substituting the hydrogen atom of the terminal hydroxy group include alkyl group (or polyalkylene glycol alkyl ether), and acyl group (or polyalkylene glycol ester). Polyalkylene glycol having hydroxyl groups at all terminals is more preferable. While compounds having a plurality (preferably 2 or 3) polyalkylene glycol chains bonded via linking group(s) may be used, those having straight chain structures without branching of the polyalkylene glycol chain are more preferable. In particular, diol type polyalkylene glycol is preferable.

Preferable, specific examples of the non-polymerizable compound include polyethylene glycol and polypropylene glycol; mono- or dimethyl ether, mono- or dioctyl ether, mono- or dinonyl ether, mono- or didecyl ether of them; and monostearate, monooleate, monoadipate and monosuccinate of them.

Content of the non-polymerizable compound is preferably 0.1 to 20% by mass of the total composition excluding the solvent, more preferably 0.2 to 10% by mass, still more preferably 0.5 to 5% by mass, and most preferably 0.5 to 3% by mass.

Antioxidant

Preferably, the curable composition for imprints of the invention contains a known antioxidant. The content of the antioxidant to be in the composition is, for example, from 0.01 to 10% by mass of the total amount of the polymerizable monomers constituting the composition, preferably from 0.2 to 5% by mass. When two or more different types of antioxidants are in the composition, the total amount thereof falls within the above range.

The antioxidant is for preventing fading by heat or photoirradiation, and for preventing fading by various gases such as ozone, active hydrogen NOx, SOx (x is an integer), etc. Especially in the invention, the antioxidant added to the composition brings about the advantage that the cured film is prevented from being discolored and the film thickness is prevented from being reduced through decomposition. The antioxidant includes hydrazides, hindered amine-type antioxidants, nitrogen-containing heterocyclic mercapto compounds, thioether-type antioxidants, hindered phenol-type antioxidants, ascorbic acids, zinc sulfate, thiocyanates, thiourea derivatives, saccharides, nitrites, sulfites, thiosulfates, hydroxylamine derivatives, etc. Of those, preferred are hindered phenol-type antioxidants and thioether-type antioxidants from the viewpoint of their effect of preventing cured film discoloration and preventing film thickness reduction.

Commercial products of the antioxidant usable herein include Irganox 1010, 1035, 1076, 1222 (all by Ciba-Geigy); Antigene P, 3C, FR, Sumilizer S, Sumilizer GA80 (by Sumitomo Chemical); Adekastab AO70, AO80, AO503 (by Adeka), etc. These may be used either singly or as combined.

Polymerization Inhibitor

Furthermore, the curable composition for imprints of the invention preferably comprises a polymerization inhibitor. The content of the polymerization inhibitor is from 0.001 to 1% by mass, more preferably from 0.005 to 0.5% by mass, and even more preferably from 0.008 to 0.05% by mass, relative to all the polymerizable monomers, and the change in the viscosities over time can be inhibited while maintaining a high curing sensitivity by blending the polymerization inhibitor in an appropriate amount. The polymerization inhibitor may be added at the production of the polymerizable monomer or may be added the curable composition after the production of the polymerizable monomer.

The polymerization inhibitor may be exemplified by hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), cerium (III) salt of N-nitrosophenyl hydroxylamine, phenothiazine, phenoxazine, 4-methoxynaphthol, 2,2,6,6-tetramethylpiperidine-1-oxyl, free radical, 2,2,6,6-tetramethylpiperidine, 4-hydroxy-2,2,6,6-tetramethylpiperidine-1-oxyl, free radical, nitrobenzene, and dimethylaniline; among which preferable examples include p-benzoquinone, 2,2,6,6-tetramethylpiperidine-1-oxyl, free radical, 4-hydroxy-2,2,6,6-tetramethylpiperidine-1-oxyl, free radical, and phenothiazine.

Solvent

A solvent may be used for the curable composition for imprints of the invention, in accordance with various needs.

In particular, when a pattern having a thickness of at most 500 nm is formed, the composition preferably contains a solvent. Preferably, the solvent has a boiling point at normal pressure of from 80 to 200° C. Regarding the type of the solvent, any solvent capable of dissolving the composition may be used. Preferred are solvents having at least any one of an ester structure, a ketone structure, a hydroxyl group and an ether structure. Concretely, the solvent is preferably one or more selected from propylene glycol monomethyl ether acetate, cyclohexanone, 2-heptanone, gamma-butyrolactone, propylene glycol monomethyl ether, ethyl lactate. Most preferred is a solvent containing propylene glycol monomethyl ether acetate as securing coating uniformity.

The content of the solvent in the composition of the present invention may be suitably optimized depending on the viscosity of the constitutive ingredients except the solvent, the coatability of the composition and the intended thickness of the film to be formed. From the viewpoint of the coatability, the solvent content is preferably from 0 to 99% by mass of the composition. When the composition of the present invention is applied onto the substrate by inkjet method, it is preferred that the composition does not substantially contain a solvent (for example 3% by mass or less, preferably 1% by mas or less). On the other hand, when a pattern having a film thickness of 500 nm or less is formed by spin-coating method or the like, the content may be 20 to 99% by mass, preferably 40 to 99% by mass, specifically preferably 70 to 98% by mass. In the present invention, a curable composition not comprising a solvent achieves an extreme effect when the pattern is formed by inkjet.

Polymer Ingredient

The composition of the invention may contain a poly-functional oligomer having a larger molecular weight than that of the above-mentioned, other poly-functional monomer within a range capable of attaining the object of the invention, for the purpose of further increasing the crosslinking density of the composition. Examples of the photoradical-polymerizable poly-functional oligomer include various acrylate oligomers such as polyester acrylates, urethane acrylates, polyether acrylates, epoxy acrylates. The amount of the oligomer ingredient to be added to the composition may be preferably from 0 to 30% by mass of the composition except the solvent therein, more preferably from 0 to 20% by mass, even more preferably from 0 to 10% by mass, most preferably from 0 to 5% by mass.

The curable composition for imprints of the present invention may further contain a polymer component, in view of improving the dry etching resistance, imprint suitability and curability. The polymer component preferably has a polymerizable functional group in the side chain thereof. Weight-average molecular weight of the polymer component is preferably 2,000 to 100,000, and more preferably 5,000 to 50,000, in view of compatibility with the polymerizable monomer. Amount of addition of the polymer component, with respect to portion of the composition excluding the solvent, is preferably 0 to 30% by mass, more preferably 0 to 20% by mass, and most preferably 2% by mass or less. Pattern formability may be improved by adjusting the content of polymer component having a molecular weight of 2,000 or larger, with respect to the portion of the curable composition for imprints of the present invention excluding the solvent. From the viewpoint of pattern formability, as least as possible amount of resin component is preferable, and therefore the curable composition preferably contains no polymer component other than those composing the surfactant or trace amounts of additives.

In addition to the above-mentioned ingredients, the curable composition for imprints of the invention may contain, if desired, UV absorbent, light stabilizer, antiaging agent, plasticizer, adhesion promoter, thermal polymerization initiator, colorant, elastomer particles, photoacid enhancer, photobase generator, basic compound, flowability promoter, defoaming agent, dispersant, etc.

The curable composition for imprints of the invention can be produced by mixing the above-mentioned ingredients. The ingredients may be mixed and dissolved to prepare the curable composition, generally at a temperature falling within a range of from 0° C. to 100° C. After the ingredients are mixed, the resulting mixture may be filtered through a filter having a pore size of from 0.003 μm to 5.0 μm to give a solution. The filtration may be effected in plural stages, or may be repeated plural times. The solution once filtered may be again filtered. Not specifically defined, the material of the filter may be any one, for example, polyethylene resin, polypropylene resin, fluororesin, nylon resin, etc.

The viscosity of the curable composition for imprints of the invention, except the solvent therein, at 25° C. is at most 100 mPa·s, more preferably from 1 to 70 mPa·s, even more preferably from 2 to 50 mPa·s, still more preferably from 3 to 30 mPa·s.

The composition may be transported or stored at ordinary temperature, but for preventing the permanent film from being degraded, it is preferably transported or stored at a controlled temperature of from −20° C. to 0° C. Needless-to-say, the composition is shielded from light to such a level on which its reaction does not go on.

In permanent films (resists for structural members) for use in liquid-crystal displays (LCD) and in resists for use for substrate processing for electronic materials, the resist is preferably prevented from being contaminated as much as possible with metallic or organic ionic impurities in order that the resist does not interfere with the performance of the products. Accordingly, the concentration of the metallic or organic ionic impurities in the curable composition for imprints of the invention is preferably at most 1 ppm, more preferably at most 100 ppb, even more preferably at most 10 ppb.

<Method of Forming Film>

The underlay film composition of the present invention is applied onto the substrate to form an underlay film. Methods of application onto the substrate include dip coating, air knife coating, curtain coating, wire bar coating, gravure coating, extrusion coating, spin coating, slit scanning, and ink jet process, by which a coated film or liquid droplets are formed on the substrate. From the viewpoint of uniformity of thickness, coating process is preferable, and spin coating is more preferable. The solvent is then dried off. Preferable drying temperature is 70° C. to 130° C. The drying is preferably followed by curing with the aid of activation energy (preferably heat and/or light). It is preferable to proceed the curing under heating at 150° C. to 250° C. The drying-off of the solvent and the curing may be proceeded at the same time. As described above, it is preferable in the present invention to apply the underlying film composition, to partially cure the underlying film composition by heating or photo-irradiation, and to apply the composition for imprints. By employing such means, also the underlying film composition will completely cure in the process of photo-curing of the curable composition for imprints, and thereby the adhesiveness will tend to improve.

Thickness of the underlay film composed of the composition of the present invention may vary depending on applications, and it falls in the range approximately from 0.1 nm to 100 nm, preferably from 0.5 to 20 nm, more preferably from 1 to 10 nm. The underlay film composition of the present invention may be coated multiple times. The obtained underlay film is preferably smooth as possible.

<Substrate>

The substrate (base or support) on which the adhesion-promoting composition of the present invention is coated is selectable depending of various purposes of use, and is exemplified by quartz, glass, optical film, ceramic material, evaporated film, magnetic film, reflective film, metal substrates composed of Ni, Cu, Cr, Fe and so forth, paper, SOC (Spin On Carbon), SOG (Spin On Glass), polymer substrates composed of polyester film, polycarbonate film, polyimide film and so forth, substrate with TFT array, electrode plate for PDP, substrate composed glass or translucent plastic, electro-conductive substrates composed of ITO, metal and so forth, insulating substrate, and semiconductor-manufacturing substrates composed of silicon, silicon nitride, polysilicon, silicon oxide, amorphous silicon and so forth, without special limitation. In particular in the present invention, an appropriate underlying layer may be formed even if a substrate with a small surface energy (approximately 40 to 60 mJ/m$^2$, for example) is used. If, however, the substrate will be used in an etching process, the semiconductor-manufacturing substrate is preferable as described later.

A stack, configured in the present invention by using the substrate, the underlying layer and a pattern composed of the curable composition for imprints, may be used as an etching resist. The substrate in this case is exemplified by substrate (silicon wafer) having formed thereon SOC (Spin On Carbon), SOG (Spin On Glass), or thin film of SiO$_2$ or silicon nitride.

A plurality of substrates may be etched at the same time. The stack, configured in the present invention by using the substrate, the underlying layer and a pattern composed of the curable composition for imprints, is also beneficial when it is used as a permanent film in devices or structures, in its intact form, or after removing therefrom any residual film or the underlying layer remaining in the recess, since the stack is less likely to cause film separation even exposed to environmental changes or stress.

In the present invention, in particular, a substrate having on the surface thereof a polar group is preferably used. By using the substrate having on the surface thereof a polar group, the adhesiveness with the adhesion-promoting composition tends to improve. The polar group is exemplified by hydroxy group, carboxy group, silanol group and so forth. Silicon substrate and quartz substrate are particularly preferable.

Shape of the substrate may be a sheet or roll, without special limitation. The substrate is selectable from those with translucency or no translucency, depending on combination with the mold as described later.

<Process>

The pattern forming method of the present invention includes applying the adhesion-promoting composition of the present invention in a substrate to form an underlying layer; and, applying the curable composition for imprints on a surface of the underlying layer. The method further preferably includes, subsequently to the adhesion-promoting composition of the present invention in the substrate, curing by heating or photo-irradiation a part of the adhesion-promoting composition of the present invention; and applying the curable composition for imprints on a surface of the cured adhesion-promoting composition layer. The thickness of the adhesion-promoting composition of the present invention as applied (for example, coating thickness) is preferably 3 to 10 nm, and more preferably 3 to 7 nm. With a film thickness of 3 nm or larger, the adhesion-promoting composition now becomes less susceptible to the substrate, and thereby the surface quality after coating tends to improve. Too large thickness may, however, adversely affect the subsequent etching process.

The thickness after curing is preferably 3 to 10 nm, and more preferably 3 to 7 nm.

FIG. 1 is a schematic drawing illustrating an exemplary process of manufacturing involving etching of the substrate, wherein reference numeral 1 denotes the substrate, 2 denotes the underlay film, 3 denotes the curable composition for imprints, and 4 denotes the mold. As seen in FIG. 1, the underlay film composition 2 is applied onto the surface of the substrate 1 (2), the curable composition for imprints 3 is applied onto the surface (3), and the mold is applied onto the surface (4). After photo-irradiation, the mold is separated (5). The etching is conducted conforming to the resultant pattern composed of the curable composition for imprints (6). The curable composition for imprints 3 and the underlay film composition 2 are then separated, to thereby obtain the substrate having a desired pattern formed therein (7). In this process, adhesiveness between the substrate 1 and the curable composition for imprints 3 is important, since poor adhesiveness prevents the pattern of the mold 4 from being exactly transferred.

More specifically, pattern forming method of the present invention include applying over a substrate the adhesion-promoting composition of the present invention to form an underlying layer, and applying over the surface of the underlying layer the curable composition for imprints. More preferably, the method further includes, subsequently to applying over the substrate the adhesion-promoting composition of the present invention, curing by heating or photo-irradiation a part of the adhesion-promoting composition; and applying over the surface thereof the curable composition for imprints. In general, the method includes subjecting the curable composition for imprints and the underlying layer, being held between the substrate and a finely-patterned mold, to photo-irradiation to thereby cure the curable composition for imprints; and removing the mold. Details will be given below.

The adhesion-promoting composition of the present invention and the curable composition for imprints may be applied respectively over the substrate and the underlying layer, by any of methods well known to the public. The methods of application include dip coating, air knife coating, curtain coating, wire bar coating, gravure coating, extrusion coating, spin coating, slit scanning, and ink jet process, by which a coated film or liquid droplets are formed on the underlay film. Thickness of the pattern forming layer composed of the curable composition for imprints used in the present invention is approximately 0.03 μm to 30 μm, which may vary depending on applications. The curable composition for imprints may be coated according to a multiple-coating scheme. In a method of forming liquid droplets onto the underlay film typically by ink jet process, liquid droplets preferably has a volume of approximately 1 pl to 20 pl, and are arranged on the underlay film while being spaced from each other.

Next, in the patterning method of the invention, a mold is pressed against the surface of the patterning layer for transferring the pattern from the mold onto the patterning layer. Accordingly, the micropattern previously formed on the pressing surface of the mold is transferred onto the patterning layer.

Alternatively, the composition for imprints may be coated over the mold having a pattern formed thereon, and the under layer film may be pressed thereto.

Next, the mold material adoptable to the present invention will be explained. For photo-imprint lithography using the curable composition for imprints, a light-transmissive material is selected for composing at least either one of the mold and substrate. In the photoimprinting lithography adopted to the present invention, the curable composition for imprints is coated over the substrate to form the pattern forming layer, the light-transmissive mold is pressed to the surface thereof, and light is irradiated from the back side of the mold to thereby cure the pattern forming layer. Alternatively, the curable composition for imprints may be coated over the light-transmissive substrate, the mold may be pressed thereto, and light may be irradiated from the back side of the substrate to thereby cure the curable composition for imprints. The photoirradiation may be conducted while keeping the mold in contact or after releasing the mold. The photoirradiation with the mold kept in contact is preferred in the present invention.

The mold adoptable to the present invention has a pattern to be transferred. The pattern on the mold may be formed typically by photolithography, electron beam lithography or the like, depending on a desired level of process accuracy, without limiting methods of forming the mold pattern. Alternatively, a pattern formed by the pattern formation method of the present invention may be used as a mold.

Materials for composing the light-transmissive mold used in the present invention are arbitrarily selectable from those having predetermined levels of strength and durability, without special limitation. Specific examples thereof include glass, quartz, light-transmissive resins such as PMMA and polycarbonate resin, transparent metal evaporated film, flexible film such as polydimethyl siloxane, photo-cured film and metal film.

Non-light-transmissive mold materials, adoptable to the present invention when the light-transmissive substrate is used, are arbitrarily selectable from those having predetermined levels of strength, without special limitation. Specific examples thereof include ceramic material, evaporated film, magnetic film, reflective film, metal substrates composed of Ni, Cu, Cr or Fe, and substrates composed of SiC, silicon, silicon nitride, polysilicon, silicon oxide or amorphous silicon, without special limitation. Also geometry of the substrate is not specifically limited, and may be given in the form of sheet or roll. The mold in the roll form is adopted when continuity in production is required for pattern transfer.

The mold used in the pattern formation method of the present invention may be treated with a mold releasing agent, aiming at improving separability between the curable composition for imprints and the mold surface. Examples of this sort of mold include those treated with a silicone-based or fluorine-containing silane coupling agent, also commercially available under the trade name of Optool DSX from Daikin Industries Ltd., and Novec EGC-1720 from Sumitomo 3M Ltd.

When the curable composition for imprints is used in photo-imprinting lithography, the pattern formation method of the present invention is preferably conducted under a mold pressure of 10 atm or below. By adjusting the mold pressure to 10 atm or below, there are tendencies of suppressing deformation of the mold and substrate, and improving the pattern accuracy. The low pressure is preferable also in terms of possibility of downsizing the apparatus. The mold pressure is selectable within the range capable of ensuring uniformity in the mold transfer, when observed in a region of the curable composition for imprints thinned under projected portions of the mold.

In the pattern formation method of the present invention, energy of photo-irradiation in the process of irradiating light to the pattern forming layer is good enough if it is sufficiently larger than a level energy required for curing. The level of energy of irradiation required for curing is appropriately determined, by analyzing consumption of the unsaturated bonds of the curable composition for imprints and tackiness of the cured film.

In the photoimprinting lithography adoptable to the present invention, while the photoirradiation is generally conducted while keeping the substrate to normal temperature, the photoirradiation may also be conducted under heating in order to enhance the reactivity. Also the photoirradiation in vacuo is preferable, since vacuum established prior to the photoirradiation is effective in preventing entrainment of bubbles, suppressing lowering in the reactivity due to invasion of oxygen, and enhancing adhesiveness between the mold and the curable composition for imprints. In the pattern formation method of the present invention, a preferable degree of vacuum in the photoirradiation is in the range from $10^{-1}$ Pa to normal pressure.

Light to be used for photoirradiation to cure the curable composition for imprints of the invention is not specifically defined. For example, it includes light and irradiations with a wavelength falling within a range of high-energy ionizing radiation, near-ultraviolet, far-ultraviolet, visible, infrared, etc. The high-energy ionizing radiation source includes, for example, accelerators such as Cockcroft accelerator, Handegraf accelerator, linear accelerator, betatoron, cyclotron, etc. The electron beams accelerated by such an accelerator are used most conveniently and most economically; but also are any other radioisotopes and other radiations from nuclear reactors, such as gamma rays, X rays, α rays, neutron beams, proton beams, etc. The UV sources include, for example, UV fluorescent lamp, low-pressure mercury lamp, high-pressure mercury lamp, ultra-high-pressure mercury lamp, xenon lamp, carbon arc lamp, solar lamp, etc. The radiations include microwaves, EUV, etc. In addition, laser rays for use in microprocessing of semiconductors, such as LED, semiconductor laser ray, 248 nm KrF excimer laser ray, 193 nm ArF excimer laser ray and others, are also favorably used in the invention. These lights may be monochromatic lights, or may also be lights of different wavelengths (mixed lights).

In photoexposure, the light intensity is preferably within a range of from 1 mW/cm$^2$ to 50 mW/cm$^2$. When the light intensity is at least 1 mW/cm$^2$, then the producibility may increase since the photoexposure time may be reduced; and when the light intensity is at most 50 mW/cm$^2$, then it is favorable since the properties of the permanent film formed may be prevented from being degraded owing to side reaction. Also preferably, the dose in photoexposure is within a range of from 5 mJ/cm$^2$ to 1000 mJ/cm$^2$. When the dose is less than 5 mJ/cm$^2$, then the photoexposure margin may be narrow and there may occur problems in that the photocuring may be insufficient and the unreacted matter may adhere to mold. On the other hand, when the dose is more than 1000 mJ/cm$^2$, then the composition may decompose and the permanent film formed may be degraded.

Further, in the exposure, in order to prevent radical polymerization due to oxygen, the concentration of oxygen may be controlled to be less than 100 mg/L by leading inactive gas such as nitrogen or argon.

In the patterning method of the invention, after the pattern layer (a layer comprising the curable composition for imprints layer) is cured through photoirradiation, if desired, the cured pattern may be further cured under heat given thereto. The method may additionally include the post-curing step. Thermal curing of the composition of the invention after photoirradiation is preferably attained at 150 to 280° C., more preferably at 200 to 250° C. The heating time is preferably from 5 to 60 minutes, more preferably from 15 to 45 minutes.

The patterned stacked article of the present invention, composed of the substrate, the underlay film for imprints, and the curable composition for imprints, may be used as a permanent film (resist used as structural components) used for liquid crystal display (LCD) and so forth.

EXAMPLE

The characteristics of the invention are described more concretely with reference to Production Examples and Examples given below. In the following Examples, the material used, its amount and the ratio, the details of the treatment and the treatment process may be suitably modified or changed not overstepping the scope of the invention. Accordingly, the invention should not be limitatively interpreted by the Examples mentioned below.

<Preparation of Adhesion-Promoting Composition>

In Examples of the present invention, Compound(s) listed in Tables 1 to 3 were mixed according to the ratio of mixing (ratio by mass) listed in Table 4, and then dissolved in propylene glycol monomethyl ether acetate, to thereby prepare a 0.1% by mass solution (composition). Each composition was then allowed to pass through filters A and B, listed in Table 5, in this order. The pressure applied in this process was controlled so as to give a flow rate of 0.05 L/min. In Table 5, UPE represents ultra-high-molecular-weight polyethylene. The total flow rate of each composition was set to 1 L. Each of all compositions, passed through the filters, was confirmed to have a content of compounds with a molecular weight of 200 or smaller, but excluding the solvent, of less than 1% by mass of the solid content, using a mass analyzer JMS-GC mate II from JEOL Ltd. Each composition was then added with 3% by mass of a low-molecular-weight polymer compound composed of the same structural unit as Compound A (A1 to A6) contained in the composition, and having a molecular weight of 200 or smaller, to thereby obtain an adhesion-promoting composition.

Adhesion-promoting compositions 2' and 5' in Comparative Examples 6, 7 are as-filtered products without added with the low-molecular weight compound.

TABLE 1

| | Compound A | Molecular weight | Availability |
|---|---|---|---|
| A1 | 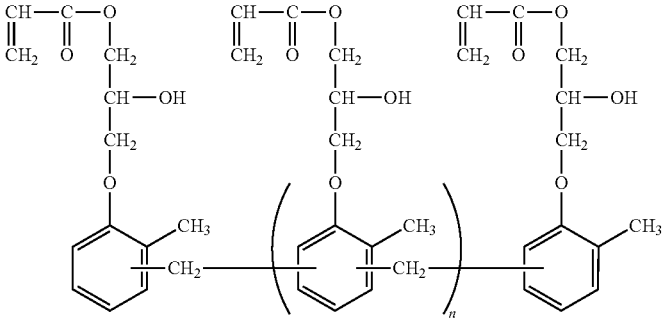 n ≈ 4 | ca. 1,500 | NK Oligo EA-7120/ PGMAc (cresol novolac-type epoxy acrylate), from Shin-Nakamura Chemical Co., Ltd. |
| A2 | 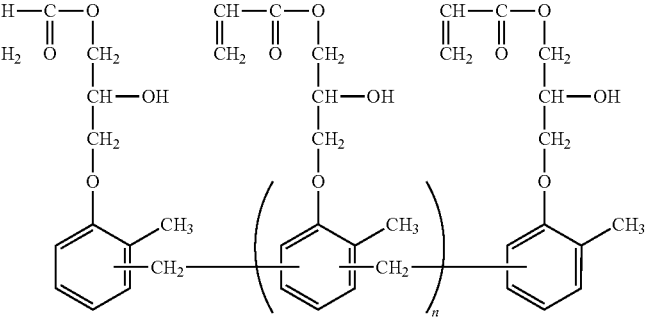 n ≈ 11 | ca. 3,500 | NK Oligo EA-7420/ PGMAc (cresol novolac-type epoxy acrylate), from Shin-Nakamura Chemical Co., Ltd. |

TABLE 1-continued

| | Compound A | Molecular weight | Availability |
|---|---|---|---|
| A3 | [Structure: three acrylate-terminated glycidyl ether units on phenol novolac backbone, n ≈ 2, n ≈ 2] | ca. 1,000 | NK Oligo EA-6320/PGMAc (phenol novolac-type epoxy acrylate), from Shin-Nakamura Chemical Co., Ltd. |
| A4 | [Structure: four acrylate-terminated glycidyl ether units on cresol novolac backbone with one unit carboxylic anhydride-modified; Average m + n ≈ 4, Average n/(m + n) ≈ 0.5] | ca. 2,000 | NK Oligo EA-7140/PGMAc (carboxylic anhydride-modified epoxy acrylate), from Shin-Nakamura Chemical Co., Ltd. |
| A5 | [Structure: four acrylate-terminated glycidyl ether units on cresol novolac backbone with one unit carboxylic anhydride-modified; Average m + n ≈ 11, Average n/(m + n) ≈ 0.5] | ca. 4,500 | NK Oligo EA-7440/PGMAc (carboxylic anhydride-modified epoxy acrylate), from Shin-Nakamura Chemical Co., Ltd. |
| A6 | [Structure: four acrylate-terminated glycidyl ether units on phenol novolac backbone with one unit carboxylic anhydride-modified; Average m + n ≈ 2, Average n/(m + n) ≈ 0.5] | ca. 1,400 | NK Oligo EA-6340/PGMAc (carboxylic anhydride-modified epoxy acrylate), from Shin-Nakamura Chemical Co., Ltd. |

TABLE 2

| Cross-linking agent | | Molecular weight | Availability |
|---|---|---|---|
| K1 | Methyl etherified melamine resin | ca. 390 | Cymel 303ULF, from Cytec Industries Inc. |

TABLE 3

| Catalyst | | Molecular weight | Availability |
|---|---|---|---|
| S1 | p-Toluenesulfonic acid | ca. 170 | Cycat 4040, from Cytec Industries Inc. |

TABLE 4

| | Adhesion-promoting composition | | | | | | | | |
|---|---|---|---|---|---|---|---|---|---|
| | 1 | 2 | 3 | 4 | 5 | 6 | 7 | 8 | 9 |
| A1 | 100 | | | | | | | | |
| A2 | | 100 | | | | | | | |
| A3 | | | 100 | | | | | | |
| A4 | | | | 100 | | | 79 | | |
| A5 | | | | | 100 | | | 79 | |
| A6 | | | | | | 100 | | | 79 |
| K1 | | | | | | | 20 | 20 | 20 |
| S1 | | | | | | | 1 | 1 | 1 |

TABLE 5

| Filter | Effective filter area [cm²] | Pore size [µm] | Filter material | Trade name, Manufacturer |
|---|---|---|---|---|
| Filter A | 600 | 0.2 | UPE | Optimizer D600, Nihon Entegris K.K. |
| Filter B | 300 | 0.05 | UPE | Optimizer D300, Nihon Entegris K.K. |

<Temporal Stability>

The adhesion-promoting compositions obtained above were allowed to stand still in the dark for 365 days respectively at 2° C., 23° C., 35° C., 50° C., the number of particles generated in the liquid was then counted using a particle counter KS-41 from RION Co., Ltd., and increase in the number of particles calculated by the equation below was evaluated.

Increase in number of particles=(number of particles after elapse of time)−(initial number of particles)

Density of particle of 0.25 µm or larger in 1 ml of the curable composition was measured as the number of particles, and evaluated according to the criteria below:
3: less than 1 particle;
2: 1 particle or more, and less than 5 particles; and
1: 5 particles of more.

Results are summarized in Table below. Table shows the results obtained after storage respectively at 2° C., 23° C., 35° C. and 50° C. in this order.

TABLE 6

| Adhesion-promoting composition | Temporal stability |
|---|---|
| 1 | 3/3/3/3 |
| 2 | 3/3/3/3 |

TABLE 6-continued

| Adhesion-promoting composition | Temporal stability |
|---|---|
| 2' | 3/3/3/3 |
| 3 | 3/3/3/2 |
| 4 | 3/3/3/2 |
| 5 | 3/3/3/2 |
| 5' | 3/3/3/2 |
| 6 | 3/3/2/2 |
| 7 | 2/1/1/1 |
| 8 | 1/1/1/1 |
| 9 | 2/1/1/1 |

<Preparation of Curable Composition for Imprints>

The polymerizable monomers, the polymerization initiator and the additives listed in Table below were mixed, and 4-hydroxy-2,2,6,6-tetramethylpiperidine-1-oxyl, free radical (from Tokyo Chemical Industry Co., Ltd.) was further added as a polymerization inhibitor, so as to control the content thereof to 200 ppm (0.02% by mass) relative to the polymerizable monomer. Each mixture was filtered through a 0.1-µm polytetrafluoroethylene filter, to thereby prepare a curable composition for imprints. Values in Table are given in ratio by mass.

TABLE 7

| | NIL1 | NIL2 |
|---|---|---|
| R-1 | | 50 |
| R-2 | 100 | 49.5 |
| R-3 | | 0.5 |
| P-1 | 3 | 3 |
| X1 | 1 | |
| X2 | 2 | 2 |

[Chemical Formula 2]

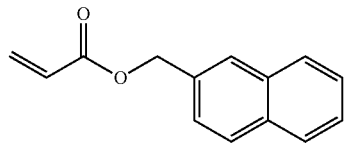

R-1

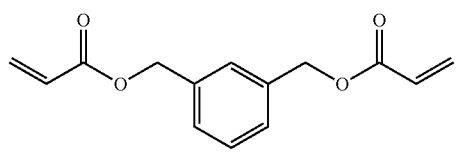

R-2

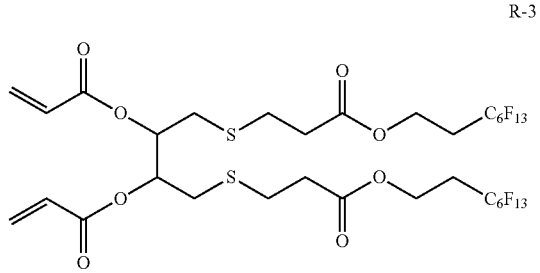

R-3

TABLE 8

| R-1 | Synthesized by a general method using 2-bromomethylnaphthalene and acrylic acid |
|---|---|

TABLE 8-continued

| | |
|---|---|
| R-2 | Synthesized by a general method using α,α'-dichloro-m-xylene and acrylic acid |
| R-3 | Synthesized by a method described in JP-A-2010-239121 |

[Photo-Polymerization Initiator]

P-1:

(2-dimethylamino-2-(4-methylbenzyl)-1-(4-morpholine-4-ylphenyl)butane-1-one (Irgacure 379EG, from BASF)

[Surfactant]

X1: PF-636 (fluorine-containing surfactant, from OMNOVA Solutions Inc.)

[Additive]

X2: polypropylene glycol: from Wako Pure Chemical Industries, Ltd.

<Pattern Formation>

A quartz mold having a rectangular line-and-space pattern (1:1) with a line width of 60 nm and a pattern depth of 100 nm was used as the mold. As the substrate, any of substrates listed in Table 9 below was used.

The adhesion-promoting composition obtained above was spin-coated respectively over the substrates, and dried on a hot plate at 100° C. for one minute to dry off the solvent. The product was then heated at 220° C. for 5 minutes for curing, to thereby form the underlying layer. The thickness of the cured film was found to be 3 nm.

On the thus-obtained underlying layer, the curable composition for imprints was discharged using an inkjet printer DMP-2831 from FUJIFILM Dimatix, Inc., with a volume of droplet per nozzle of 1 pl. In this process, the timing of discharge was controlled to arrange the droplets in a square matrix on a pitch of approximately 100 μm, so as to give a resultant residual patterned film of 10 nm thick. The temperature of the curable composition for imprints to be discharged was controlled to 25° C. A mold was placed thereon under a nitrogen gas flow, so as to fill the mold with the curable composition for imprints, and the stack was exposed to light at a dose of 300 mJ/cm$^2$ which is irradiated through the mold using a mercury lamp. After the exposure, the mold was released to obtain a pattern.

TABLE 9

| Type of Substrate | Surface energy (mJ/m$^2$) |
|---|---|
| Silicon wafer | 73 |
| Silicon wafer with spin-on glass (SOG) coating | 55 |
| Silicon wafer with spin-on carbon (SOC) coating | 53 |

<Evaluation of Pattern Failure>

The obtained patterns were inspected in a dark field under an optical microscope (at 50× to 1,500× magnification) as described below. First, a 2-mm square field at a magnification of 50× was determined. Next, the field of inspection was scanned to search release failure. The release failure was determined by detection of any scattered light, not found in normal patterns. The total number of release failure was counted for each substrate.

A: zero failure per 1-cm square area;

B: 1 to 2 failures per 1-cm square area; and

C: 3 or more failures per 1-cm square area.

TABLE 10

| | Adhesion-promoting composition | Curable composition for imprints | Failure evaluation (on SOG) | Failure evaluation (on SOC) | Failure evaluation (on Si) |
|---|---|---|---|---|---|
| Example 1 | 1 | NIL1 | A | A | A |
| Example 2 | 1 | NIL2 | A | A | A |
| Example 3 | 2 | NIL1 | A | A | A |
| Example 4 | 2 | NIL2 | A | A | A |
| Example 5 | 3 | NIL1 | B | A | A |
| Example 6 | 4 | NIL1 | B | B | A |
| Example 7 | 5 | NIL1 | B | B | A |
| Example 8 | 6 | NIL1 | B | B | A |
| Comparative Example 1 | 7 | NIL1 | C | C | C |
| Comparative Example 2 | 8 | NIL1 | C | C | C |
| Comparative Example 3 | 8 | NIL2 | C | C | C |
| Comparative Example 4 | 9 | NIL1 | C | C | C |
| Comparative Example 5 | 2' | NIL1 | B | B | B |
| Comparative Example 6 | 5' | NIL1 | B | B | B |

As is clear from the results above, the number of failures in the resultant patterns was small, when the adhesion-promoting composition of the present invention was used. It was also found that the number of failures in the resultant patterns was further small, when a polymer being free from a cyclic structure in the side chain thereof was used as the compound with a molecular weight of 500 or larger and having a reactive group was used. It was additionally found that the number of pattern failures was reducible also when the substrate with a small surface energy, such as SOG or SOC, was used.

On the other hand, the compositions of Comparative Examples showed large number of pattern failures.

<Evaluation of Adhesiveness>

The underlying layer was formed respectively over the silicon wafer and quartz wafer in the same way as described in <Pattern Formation>. Over the surface of the underlying layer provided over the silicon wafer, the curable composition for imprints was discharged in the same way as described in <Pattern Formation>, the quartz wafer was placed thereon so as to bring the underlying layer into contact with the layer of the curable composition for imprints, and the stack was exposed to light at 300 mJ/cm$^2$ through the quartz wafer using a high-pressure mercury lamp. After the exposure, the quartz wafer was removed, and the mold releasing force in this process was measured.

The mold releasing force corresponds to the adhesive force between the silicon wafer and the curable composition for imprints. The mold releasing force was measured in accordance with the method described in reference to Comparative Example in paragraphs [0102] to [0107] of JP-A-2011-206977. More specifically, the measurement followed the method of releasing illustrated in steps 1 to 6 and steps 16 to 18 of FIG. 5 of this gazette.

a: adhesive force≥20 N; and b: adhesive force<20 N.

TABLE 11

| | Adhesion-promoting composition | Curable composition for imprints | Adhesive force [N] |
|---|---|---|---|
| Example 1 | 1 | NIL1 | a (>20 N) |
| Example 2 | 1 | NIL2 | a (>20 N) |

TABLE 11-continued

| | Adhesion-promoting composition | Curable composition for imprints | Adhesive force [N] |
|---|---|---|---|
| Example 3 | 2 | NIL1 | a (>20 N) |
| Example 4 | 2 | NIL2 | a (>20 N) |
| Example 5 | 3 | NIL1 | a (>20 N) |
| Example 6 | 4 | NIL1 | a (>20 N) |
| Example 7 | 5 | NIL1 | a (>20 N) |
| Example 8 | 6 | NIL1 | a (>20 N) |
| Comparative Example 1 | 7 | NIL1 | a (>20 N) |
| Comparative Example 2 | 8 | NIL1 | a (>20 N) |
| Comparative Example 3 | 8 | NIL2 | a (>20 N) |
| Comparative Example 4 | 9 | NIL1 | a (>20 N) |
| Comparative Example 5 | 2' | NIL1 | a (>20 N) |
| Comparative Example 6 | 5' | NIL1 | a (>20 N) |
| Comparative Example 7 | None | NIL1 | b (10 N) |

As is clear from Table above, the adhesiveness with the substrate was improved by using the underlying layer composition of the present invention. In contrast, the adhesiveness degraded when the underlying layer was not used.

Similar results were obtained also when the light source used for curing the curable composition in the individual Examples was changed from high-pressure mercury lamp to any of LED, metal halide lamp and excimer lamp.

Tendencies similar to those described above were confirmed, when the substrate used for measuring the adhesive force in the individual Examples was altered from silicon wafer to silicon wafer with spin-on glass (SOG) coating or quartz wafer.

REFERENCE SIGNS LIST

1 substrate
2 underlying layer
3 curable composition for imprints
4 mold

What is claimed is:

1. An adhesion-promoting composition used between a curable composition for imprints and a substrate,
   which comprises a compound having a molecular weight of 500 or larger and having a reactive group, and
   has a content of a compound, with a molecular weight of 200 or smaller, of more than 1% by mass and not more than 10% by mass of a total solid content.

2. The adhesion-promoting composition used between a curable composition for imprints and a substrate of claim 1, wherein at least one kind of the compounds having a molecular weight of 500 or larger and having a reactive group is a novolac-type epoxy (meth)acrylate polymer.

3. The adhesion-promoting composition used between a curable composition for imprints and a substrate of claim 1, wherein the compound having a molecular weight of 500 or larger and having a reactive group is a polymer being free from a cyclic structure in a side chain of the polymer.

4. The adhesion-promoting composition used between a curable composition for imprints and a substrate of claim 1, wherein the compound having a molecular weight of 500 or larger and having a reactive group is a novolac-type epoxy (meth)acrylate polymer, and is a polymer being free from a cyclic structure in a side chain of the polymer.

5. The adhesion-promoting composition used between a curable composition for imprints and a substrate of claim 1, wherein the compound having a molecular weight of 500 or larger and having a reactive group is a polymer, and; the compound having a molecular weight of 200 or smaller is a monomer which composes the polymer, or a compound obtained by polymerizing two or more of the monomers.

6. The adhesion-promoting composition used between a curable composition for imprints and a substrate of claim 1, wherein the compound having a molecular weight of 500 or larger and having a reactive group has a molecular weight of 3000 or larger.

7. The adhesion-promoting composition used between a curable composition for imprints and a substrate of claim 1, wherein the compound having a molecular weight of 500 or larger and having a reactive group is mainly composed of a structural unit represented by the formula (A) below;

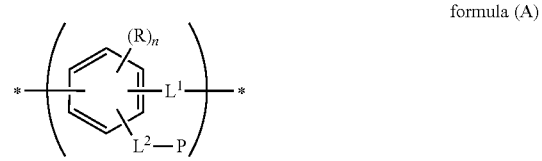

formula (A)

wherein R represents an alkyl group, each of $L^1$ and $L^2$ independently represents a divalent linking group, and P represents a polymerizable group; n represents an integer of 0 to 3.

8. The adhesion-promoting composition used between a curable composition for imprints and a substrate of claim 7, wherein P represents a (meth)acryloyl group.

9. The adhesion-promoting composition used between a curable composition for imprints and a substrate of claim 1, which comprises a solvent.

10. The adhesion-promoting composition used between a curable composition for imprints and a substrate of claim 1, which comprises a solvent in an amount of 70% by mass or more of the composition.

11. The adhesion-promoting composition used between a curable composition for imprints and a substrate of claim 1, which comprises a solvent and has 10% by mass or less, relative to a total ingredients, of ingredient other than the compound having a molecular weight of 500 or larger and having a reactive group, the compound having a molecular weight of 200 or smaller, and the solvent.

12. A cured article obtained by curing an adhesion-promoting composition for imprints and a substrate of claim 1.

13. A pattern forming method comprising:
   applying an adhesion-promoting composition used between a curable composition for imprints and a substrate of claim 1, in the substrate to form an underlying layer; and,
   applying the curable composition for imprints on a surface of the underlying layer.

14. The pattern forming method of claim 13, further comprising: subsequently to applying the adhesion-promoting composition used between a curable composition for imprints and a substrate in the substrate, curing by heating or photo-irradiation a part of the adhesion-promoting composition used between a curable composition for imprints and a substrate; and applying the curable composition for imprints on a surface thereof.

15. The pattern forming method of claim 13, further comprising:
subjecting the curable composition for imprints and the underlying layer, being held between the substrate and a finely-patterned mold, to photo-irradiation to thereby cure the curable composition for imprints; and removing the mold.

16. A method of manufacturing a semiconductor device comprising the pattern forming method of claim 13.

17. A semiconductor device manufactured by the method of manufacturing a semiconductor device of claim 16.

* * * * *